US005997810A

United States Patent [19]

Futatsuka et al.

[11] Patent Number: 5,997,810

[45] Date of Patent: Dec. 7, 1999

[54] HIGH-STRENGTH COPPER BASED ALLOY FREE FROM SMUTTING DURING PRETREATMENT FOR PLATING

[75] Inventors: Rensei Futatsuka; Junichi Kumagai; Shunichi Chiba, all of Aizuwakamatsu, Japan

[73] Assignee: Mitsubishi Shindoh Co., Ltd., Tokyo, Japan

[21] Appl. No.: 08/949,280

[22] Filed: Oct. 13, 1997

Related U.S. Application Data

[63] Continuation-in-part of application No. 08/692,331, Aug. 5, 1996, abandoned.

[30] Foreign Application Priority Data

Aug. 10, 1995 [JP] Japan .................................... 7-225730

[51] Int. Cl.[6] ....................................................... C22C 9/02

[52] U.S. Cl. .......................... 420/472; 420/482; 420/490; 420/499

[58] Field of Search .................................... 420/472, 482, 420/490, 499

[56] References Cited

U.S. PATENT DOCUMENTS 4,877,577 10/1989 Futatsuka et al. ...................... 420/473

FOREIGN PATENT DOCUMENTS

| | | |
|---|---|---|
| 61-143566 | 7/1986 | Japan . |
| 61-174345 | 8/1986 | Japan . |
| 62-133033 | 6/1987 | Japan . |
| 62-180025 | 8/1987 | Japan . |
| 63-38547 | 2/1988 | Japan . |
| 1-272733 | 10/1989 | Japan . |
| 2-122039 | 5/1990 | Japan . |
| 2-270945 | 11/1990 | Japan . |

OTHER PUBLICATIONS

Patent Abstracts of Japan, vol. 011, No. 361 (C–059), Nov. 25, 1987 of JP–A–62 133033 (Mitsubishi Metal Corp), Jun. 16, 1987 and corresponding Derwent Abstract.

Patent Abstracts of Japan, vol. 014, No. 334 (C–0742), Jul. 18, 1990 of JP–A–02 122039 (Nippon Mining Co., Ltd.), May 9, 1990 and corresponding Derwent Abstract.

Patent Abstracts of Japan, vol. 012, No. 248 (C511), Jul. 13, 1988 of JP–A–63 038547 (Furukawa Electric Co., Ltd: The), Feb. 19, 1988 and corresponding Derwent Abstract.

Database WPI, Section Ch, Week 8737, Derwent Publications Ltd., London, GB; Class L03,AN 87–260431, XP002018045 of JP–A–62 180 025 (Furukawa Electric Co., Ltd.), Aug. 7, 1987 and corresponding Patent Abstract of Japan.

Database WPI, Section Ch, Week 8632, Derwent Publications Ltd., London, GB; Class L03, AN 86–209675, XP002017727 of JP–A–61 143 566 (Nippon Mining KK), Jul. 1, 1986 and corresponding Patent Abstract of Japan.

*Primary Examiner*—Sikyin Ip

*Attorney, Agent, or Firm*—Frishauf, Holtz, Goodman, Langer & Chick, P.C.

[57] ABSTRACT

A high-strength Cu based alloy, consists of:

Ni: 0.5 to 2.0%;

Sn: 1.2 to 2.5%;

Si: 0.04 to 0.1%;

Zn: 0.1 to 1%;

Mg: 0.0001 to 0.02%;

Mn: 0.0001 to 0.1%;

P: 0.0001 to 0.02%; and

Cu and inevitable impurities: the balance, wherein the total content of Mg, Mn and P is 0.001 to 0.12%. The Cu based alloy is suitable for use as a material of electrical and electronic parts, and free from smutting during pretreatment for plating thereof.

3 Claims, No Drawings

HIGH-STRENGTH COPPER BASED ALLOY FREE FROM SMUTTING DURING PRETREATMENT FOR PLATING

The present application is a continuation-in-part application Ser. No. 08/692331 filed Aug. 5, 1996, now abandoned, the entire text of which is incorporated herein by reference.

BACKGROUND OF THE INVENTION

1. Field of the Invention

This invention relates to a copper based alloy having high strength, for use as a material of electrical and electronic parts, which is free from smutting during pretreatment for plating thereof.

2. Prior Art

Conventionally, as copper based alloys for use in the manufacture of electrical and electronic parts, such as terminals, connectors, and lead frames of semiconductor devices, there have been proposed a copper base alloy which consists essentially, by weight % (hereinafter referred to as "%"), of 1.24% nickel (Ni), 1.80% tin (Sn), 0.052% silicon (Si), 0.55% zinc (Zn), 0.0052% calcium (Ca), 0.0245% magnesium (Mg), 0.0058% lead (Pb), and the balance of copper and inevitable impurities, by Japanese Laid-Open Patent Publication (Kokai) No. 1-272733, and a copper base alloy which consists essentially of 0.05–3.0% Ni, 0.01–1.0% Si, 0.001–0.05% P, and the balance of Cu and inevitable impurities, and which may preferably contain 0.001–3.0% one or more of Zn, Sn, As, Cr, Mg, Mn, Sb, Fe, Co, Al, Ti, Zr, Be, Ag, Pg, B and lanthanide elements, as secondary components, by Japanese Laid-Open Patent Publication (Kokai) No. 2-122039 (hereinafter referred to as "the conventional Cu based alloys")

The percentage used throughout the present specification is percent by weight.

The conventional Cu based alloys are generally rolled into a sheet, and the sheet is then subjected to working, such as blanking and bending, to be formed into electrical or electronic parts with a predetermined shape, followed by plating the thus formed electrical or electronic parts, to thereby obtain final products. To plate the thus formed electrical or electronic parts, e.g. to plate the outer surfaces of leads for a semiconductor device with a solder, the leads for the semiconductor device are subjected to a pretreatment consisting of steps of alkaline electrolytic cleaning, water washing, etching, water washing, smut removing, and water washing. Then, the thus pretreated leads are subjected to plating consisting of steps of pre-dipping, solder plating, water washing, neutralization, water washing, water bathing, blowing, and drying.

Electrical and electronic parts are always demanded to be manufactured at lower costs, and to meet the demand, it is required that electrical and electronic parts should be manufactured by more efficient steps. However, electrical and electronic parts formed from the conventional Cu based alloy undergo smutting during the above-mentioned pretreatment for plating, particularly during the etching step. Since the conventional Cu based alloys contain Ni and Si as mentioned above, a chemical compound mainly composed of $Ni_2Si$ can precipitate on the surface of the Cu based alloy. A Cu based alloy of this kind is usually subjected to pretreatment and then to plating into a final product. During the pretreatment, the chemical compound mainly composed of $Ni_2Si$ on the surface of the alloy is not washed off the alloy surface but remains thereon in the form of a smut. To remove the smut, a great deal of time period is required, which unfavorably impedes an improvement in the productivity.

SUMMARY OF THE INVENTION

It is the object of the invention to provide a high-strength Cu based alloy for use as a material of electrical and electronic parts, which is free from smutting during the pretreatment for plating.

To attain the above object, the present invention provides a Cu based alloy consisting of 0.5 to 2.0% Ni, 1.2 to 2.5% Sn, 0.04 to 0.1% Si, 0.1 to 1% Zn, 0.0001 to 0.02% Mg, 0.0001 to 0.1% Mn, 0.0001 to 0.02% P, and the balance of Cu and inevitable impurities, and wherein the total content of Mg, Mn and P is 0.001 to 0.12%.

Preferably, the Cu based alloy consists of:

Ni: 0.8 to 1.8%;

Sn: 1.4 to 2.2%;

Si: 0.05 to 0.09%;

Zn: 0.2 to 0.8%;

Mg: 0.0003 to 0.015%;

Mn: 0.0005 to 0.08%;

P: 0.0005 to 0.018%; and

Cu and inevitable impurities: the balance, and wherein the total content of Mg, Mn and P is 0.004 to 0.11%.

More preferably, the Cu based alloy consists of:

Ni: 1.23 to 1.25%;

Sn: 1.22 to 2.47%;

Si: 0.070 to 0.072%;

Zn: 0.52 to 0.56%;

Mg: 0.009 to 0.012;

Mn: 0.050 to 0.051%;

P: 0.010 to 0.012%; and

Cu and inevitable impurities: the balance, and wherein the total content of Mg, Mn and P is 0.070 to 0.074%.

The above and other objects, features and advantages of the invention will be more apparent from the following detailed description.

DETAILED DESCRIPTION

From a viewpoint that electrical and electronic parts formed by a Cu based alloy which is free from smutting during the etching step can curtail a time period required for removing smut during the pretreatment for plating to thereby greatly improve the productivity, the present inventors have made studies in order to obtain a Cu based alloy having high strength, which is free from smutting during the etching step, and have reached the following finding:

If a Cu based alloy has a chemical composition consisting of 0.5 to 2.0% Ni, 1.2 to 2.5% Sn, 0.04 to 0.1% Si, 0.1 to 1% Zn, 0.0001 to 0.02% Mg, 0.0001 to 0.1% Mn, 0.0001 to 0.02% P, and the balance of Cu and inevitable impurities, and wherein the total content of Mg, Mn and P is 0.001 to 0.12%, the Cu based alloy is not only as excellent as the conventional Cu based alloy in mechanical properties, such as tensile strength, elongation, and bendability, solder-heat exfoliation resistance, and electric conductivity, but also free from smutting during the pretreatment for plating. As a result, if this Cu based alloy is used for manufacturing electrical and electronic parts such as lead frames, a working time period required for the pretreatment for plating can be drastically reduced compared with the time period required for manufacturing lead frames from the conventional Cu based alloy, leading to increased productivity thereof.

The present invention is based upon the above finding.

The contents of the component elements of the Cu based alloy according to the invention have been limited as stated above, for the following reasons:

(1) Ni

The Ni component acts to improve the strength and bendability of the Cu based alloy. However, if the Ni content is less than 0.5%, the above action cannot be performed to a desired extent, whereas if it exceeds 2%, the electric conductivity of the alloy is undesirably degraded. Therefore, the Ni content has been limited to the range of 0.5 to 2%. Preferably, the Ni content should be limited to a range of 0.8 to 1.8%.

(2) Sn

The Sn component acts, in cooperation with the Ni component, to further improve the strength and bendability of the Cu based alloy. However, if the Sn content is less than 1.2%, the above action cannot be performed to a desired extent, whereas if it exceeds 2.5%, the hot workability of the alloy is undesirably degraded. Therefore, the Sn content has been limited to the range of 1.2 to 2.5%, and preferably the Sn content should be limited to a range of 1.4 to 2.2%.

(3) Si

The Si component acts to deoxidize the Cu based alloy during melting for casting, as well as to form a nickel silicide ($Ni_2Si$) in cooperation with the Ni component to improve the thermal resistance of the Cu based alloy. However, if the Si content is less than 0.04%, the above actions cannot be performed to a desired extent, whereas if it exceeds 0.1%, the nickel silicide precipitates on the alloy surface in an increased amount and hence the amount of smut undesirably increases during etching in the pretreatment for plating. Therefore, the Si content has been limited to the range of 0.04 to 0.1%, and preferably the Si content should be limited to a range of 0.05 to 0.09%.

(4) Zn

The Zn component acts to further improve the solder-heat exfoliation resistance. However, if the Zn content is less than 0.1%, the above action cannot be performed to a desired extent, whereas if the Zn content exceeds 1%, the solderability of the alloy can be spoiled. Therefore, the Zn content has been limited to the range of 0.1 to 1%. Preferably, the Zn content should be limited to a range of 0.2 to 0.8%.

(5) Mg, Mn and P

These Mg, Mn and P components act to desulfurize the alloy as well as to fix free sulfur during melting for casting, to thereby improve the hot workability of the alloy or perform deoxidation of the same. Further, the Mg, Mn and P components coact to prevent smutting when they are contained together in the Cu based alloy. However, if the Mg, Mn and P contents are each less than 0.0001, and at the same time the total content thereof is less than 0.001%, the above action cannot be performed to a desired extent. On the other hand, if the Mg, Mn and P contents exceed 0.02%, 0.1% and 0.02%, respectively, and at the same time the total content thereof exceeds 0.12%, a further improvement in the hot workability attributed to the desulfurization, the fixing of free sulfur cannot be achieved or the effect of the deoxidation is saturated, and smut can occur. Therefore, the Mg, Mn and P contents are limited to the ranges of 0.0001 to 0.02%, 0.0001 to 0.1%, and 0.0001 to 0.02%, respectively, and at the same time the total content of the Mg, Mn and P components to 0.001 to 0.12%. Preferably, the Mg, Mn and P contents should be limited to a range of 0.0003 to 0.015%, 0.0005 to 0.08%, and 0.0005 to 0.018%, respectively, and at the same time the total content of the Mg, Mn and P components to 0.004 to 0.11%.

To produce the high-strength Cu based alloy according to the present invention, starting materials are charged into a melting furnace in such proportions that the resulting Cu based alloy has the predetermined chemical composition as described above, and they are melted in the atmospheric air with the surface of the molten alloy covered with charcoal.

Next, an example of the Cu based alloy according to the invention will be described.

EXAMPLE

Electrolytic copper was melted in a medium-frequency channel coreless smelting furnace in the atmospheric air with the surface of the molten copper covered with charcoal. The alloy component elements were added to the molten copper individually or in the form of a mother alloy, to prepare Cu based alloys having chemical compositions as shown in Tables 1–3. The thus prepared Cu based molten alloys were subjected to semi-continuous casting to produce ingots each having a size of 160 mm in thickness, 600 mm in width, and 4400 mm in length.

The ingots were hot-rolled at a temperature of 850° C. into hot-rolled plates each having a thickness of 11 mm, and the plates were immediately water-cooled, followed by scalping for removing scales therefrom. Then, the plates were repeatedly subjected to a sequence of steps of cold rolling, annealing and pickling to obtain cold-rolled sheets each having a thickness of 0.375 mm. Further, the sheets were annealed in a continuous annealing furnace at a temperature of 750° C., and then cold-rolled to obtain cold-rolled sheets each having a thickness of 0.15 mm, followed by final annealing of the cold-rolled sheets in the continuous annealing furnace at a temperature of 500° C. for 20 sec, to relieve strain, to thereby produce cold-rolled sheets of Cu based alloys Nos. 1 to 15 according to the present invention, a conventional Cu based alloy No. 1 according to Japanese Laid-Open Patent Publication (Kokai) No. 1-272733, and conventional Cu based alloys Nos. 1–9 according to Japanese Laid-Open.Patent Publication (Kokai) No. 2-122039.

The cold-rolled sheets of the Cu based alloys Nos. 1 to 15 according to the present invention, conventional Cu based alloy No. 1 according to Japanese Laid-Open Patent Publication (Kokai) No. 1-272733, and conventional Cu based alloys Nos. 1–9 according to Japanese Laid-Open.Patent Publication (Kokai) No. 2-122039, which each have a thickness 0.15 mm, were cut into specimens each having a size of 35 mm in width and 45 mm in length. The specimens were subjected to electrolytic decreasing in an aqueous solution containing:

NaOH: 60 g/liter, and $2Na_2O.SiO_2$: 40 g/liter, under the following conditions:

Bath temperature: 43° C.,

Bath voltage: 5 V, and

Energization time: 120 sec.

The specimens were then washed with water, and subjected to a pretreatment for plating, i.e. etching, water-washing and drying. The etching was conducted in an aqueous solution containing:

$H_2O_2$: 60 g/liter, and $H_3PO_4$: 100 ml/liter, under the following conditions:

Bath temperature: 35° C., and

Soaking time: 60 sec.

The surfaces of the specimens thus pretreated were examined for the presence of smut. Results of the examination are shown in Tables 1–3.

As is clear from the results shown in Tables 1–3, smut was perceived on the surfaces of the conventional Cu based alloy specimen 1 according to Japanese Laid-Open Patent Publication (Kokai) No. 1-272733, and conventional Cu based alloy specimens Nos. 1–9 according to Japanese Laid-Open.Patent Publication (Kokai) No. 2-122039, but no smut was perceived on the surface of any of the Cu based alloy specimens 1 to 15 according to the present invention. Therefore, in manufacturing electrical and electronic parts such as lead frames of semiconductor devices

TABLE 1

| SPECIMEN | | CHEMICAL COMPOSITION (wt %) | | | | | | | | | |
|---|---|---|---|---|---|---|---|---|---|---|---|
| | | Ni | Sn | Si | Zn | Mg | Mn | P | (Mg + Mn + P) | Cu & INEVITABLE IMPURITIES | SMUT |
| Cu ALLOYS ACCORD. TO PRESENT INVENTION | 1 | 0.53 | 1.80 | 0.071 | 0.52 | 0.011 | 0.049 | 0.009 | 0.069 | BAL. | ABSENT |
| | 2 | 1.23 | 1.78 | 0.070 | 0.56 | 0.012 | 0.051 | 0.011 | 0.074 | BAL. | ABSENT |
| | 3 | 1.99 | 1.81 | 0.069 | 0.51 | 0.010 | 0.048 | 0.008 | 0.066 | BAL. | ABSENT |
| | 4 | 1.25 | 1.22 | 0.072 | 0.54 | 0.010 | 0.050 | 0.012 | 0.072 | BAL. | ABSENT |
| | 5 | 1.24 | 2.47 | 0.071 | 0.52 | 0.009 | 0.051 | 0.010 | 0.070 | BAL. | ABSENT |
| | 6 | 1.23 | 1.80 | 0.042 | 0.51 | 0.011 | 0.052 | 0.009 | 0.072 | BAL. | ABSENT |
| | 7 | 1.24 | 1.79 | 0.098 | 0.55 | 0.012 | 0.049 | 0.012 | 0.073 | BAL. | ABSENT |
| | 8 | 1.25 | 1.81 | 0.070 | 0.11 | 0.010 | 0.051 | 0.009 | 0.070 | BAL. | ABSENT |

TABLE 2

| SPECIMEN | | CHEMICAL COMPOSITION (wt %) | | | | | | | | | |
|---|---|---|---|---|---|---|---|---|---|---|---|
| | | Ni | Sn | Si | Zn | Mg | Mn | P | (Mg + Mn + P) | Cu & INEVITABLE IMPURITIES | SMUT |
| Cu ALLOYS ACCORD. TO PRESENT INVENTION | 9 | 1.23 | 1.78 | 0.071 | 0.97 | 0.009 | 0.050 | 0.010 | 0.069 | BAL. | ABSENT |
| | 10 | 1.22 | 1.82 | 0.068 | 0.54 | 0.0002 | 0.049 | 0.009 | 0.0582 | BAL. | ABSENT |
| | 11 | 1.21 | 1.80 | 0.071 | 0.54 | 0.018 | 0.051 | 0.011 | 0.080 | BAL. | ABSENT |
| | 12 | 1.20 | 1.79 | 0.070 | 0.54 | 0.010 | 0.0001 | 0.010 | 0.0201 | BAL. | ABSENT |
| | 13 | 1.24 | 1.81 | 0.069 | 0.53 | 0.011 | 0.098 | 0.009 | 0.118 | BAL. | ABSENT |
| | 14 | 1.23 | 1.82 | 0.072 | 0.49 | 0.009 | 0.049 | 0.0002 | 0.0582 | BAL. | ABSENT |
| | 15 | 1.22 | 1.81 | 0.068 | 0.50 | 0.012 | 0.050 | 0.019 | 0.081 | BAL. | ABSENT |
| CONVENTIONAL Cu ALLOY 1 | | 1.24 | 1.80 | 0.052 | 0.55 | 0.0245 | Ca: 0.0052, Pb: 0.0058 | | | BAL. | PRESENT |

TABLE 3

| SPECIMEN | | CHEMICAL COMPOSITION (wt %) | | | | | |
|---|---|---|---|---|---|---|---|
| | | Ni | Si | P | SECONDARY ELEMENT | Cu & INEVITABLE IMPURITIES | SMUT |
| Cu ALLOYS ACCORD. TO JP02-122039 | 1 | 1.01 | 0.22 | 0.013 | — | BAL. | PRESENT |
| | 2 | 1.05 | 0.23 | 0.022 | Zn 0.31, Co 0.05, Al 0.012 | BAL. | PRESENT |
| | 3 | 1.62 | 0.40 | 0.011 | Sn 0.41, As 0.008, B 0.007 | BAL. | PRESENT |
| | 4 | 1.63 | 0.41 | 0.033 | Cr 0.04, Fe 0.12, Pb 0.004 | BAL. | PRESENT |
| | 5 | 1.65 | 0.42 | 0.021 | — | BAL. | PRESENT |
| | 6 | 3.04 | 0.65 | 0.005 | Mg 0.12, Mn 0.15 | BAL. | PRESENT |
| | 7 | 3.11 | 0.63 | 0.026 | Sb 0.01, Ti 0.07, La 0.004 | BAL. | PRESENT |
| | 8 | 3.08 | 0.61 | 0.011 | Zr 0.12, Ag 0.03 | BAL. | PRESENT |
| | 9 | 3.00 | 0.60 | 0.014 | Be 0.12, Co 0.05 | BAL. | PRESENT |

formed of the Cu based alloy sheets according to the present invention, the working time required for the pretreatment steps for plating can be drastically curtailed and hence the productivity can be greatly improved to thereby reduce the manufacturing cost, which brings about industrially useful effects.

What is claimed is:

1. A Cu based alloy having high strength, which is free from smutting during pretreatment for plating thereof, consisting, by weight %, of:

Ni: 0.5 to 2.0%;

Sn: 1.2 to 2.5%;

Si: 0.04 to 0.1%;

Zn: 0.1 to 1%;

Mg: 0.0001 to 0.02;

Mn: 0.0001 to 0.1%;

P: 0.0001 to 0.02%; and

Cu and inevitable impurities: the balance, and wherein the total content of Mg, Mn and P is 0.001 to 0.12%.

2. The Cu based alloy having high strength, as claimed in claim 1, consisting of:

Ni: 0.8 to 1.8%;

Sn: 1.4 to 2.2%;

Si: 0.05 to 0.09%;

Zn: 0.2 to 0.8%;

Mg: 0.0003 to 0.015%;

Mn: 0.0005 to 0.08%;

P: 0.0005 to 0.018%; and

Cu and inevitable impurities: the balance, and wherein the total content of Mg, Mn and P is 0.004 to 0.11%.

3. The Cu based alloy having high strength, as claimed in claim 2, consisting of:

Ni: 1.23 to 1.25%;

Sn: 1.22 to 2.47%;

Si: 0.070 to 0.072%;

Zn: 0.52 to 0.56%;

Mg: 0.009 to 0.012;

Mn: 0.050 to 0.051%;

P: 0.010 to 0.012%; and

Cu and inevitable impurities: the balance, and wherein the total content of Mg, Mn and P is 0.070 to 0.074%.

* * * * *